(12) United States Patent
Kim et al.

(10) Patent No.: US 9,019,471 B2
(45) Date of Patent: Apr. 28, 2015

(54) MASKLESS EXPOSURE APPARATUS AND STITCHING EXPOSURE METHOD USING THE SAME

(75) Inventors: Jeong Min Kim, Suwon-si (KR); Sang Don Jang, Suwon-si (KR); Sang Woo Bae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1055 days.

(21) Appl. No.: 13/064,679

(22) Filed: Apr. 8, 2011

(65) Prior Publication Data

US 2011/0267594 A1 Nov. 3, 2011

(30) Foreign Application Priority Data

Apr. 29, 2010 (KR) .................. 10-2010-0040249

(51) Int. Cl.
*G03B 27/42* (2006.01)
*G03F 7/20* (2006.01)

(52) U.S. Cl.
CPC .................................. *G03F 7/2051* (2013.01)

(58) Field of Classification Search
CPC ....... G01D 21/00; G01D 11/30; G01D 7/005; G01D 11/245; G01D 15/00; G01D 3/024; G01D 3/028; G01D 5/342
USPC .................... 355/53, 55, 63, 72, 77
See application file for complete search history.

(56) References Cited

U.S. PATENT DOCUMENTS

2010/0231985 A1* 9/2010 Kinjo et al. .................. 358/474

FOREIGN PATENT DOCUMENTS

| JP | 2008046383 | 2/2008 |
|----|------------|--------|
| KR | 20060048868 | 5/2006 |

OTHER PUBLICATIONS

Office Action issued by the Korean Patent Office dated Jul. 29, 2011

* cited by examiner

*Primary Examiner* — Steven H Whitesell Gordon
*Assistant Examiner* — Mesfin T Asfaw
(74) *Attorney, Agent, or Firm* — Harness, Dickey & Pierce, PLC

(57) ABSTRACT

Disclosed herein are a maskless exposure apparatus configured to perform exposure by tilting a beam spot array with respect to a scan direction (Y-axis direction) thus preventing stitching stripes and a stitching method using the same. A step distance, in which exposure dose uniformity in a stitching area is within a tolerance range, is calculated using actual position data of beam spots constituting the beam spot array on an exposure plane, and if necessary, using beam power data and/or beam size data. As exposure is performed based on image data conforming to the step distance, the stitching area has a uniform exposure dose, enabling exposure without stitching stripes.

20 Claims, 19 Drawing Sheets

FIG. 14

|  | HEAD A | HEAD B |
|---|---|---|
| NUMBER OF SPOT ARRAY ROW | 1920x400 | 1920x402 |
| ROTATION ALIGNMENT ANGLE | 0.42971° | 0.42771° |
| DISTANCE BETWEEN SPOTS (DISTORTION) | 35.3um (+5um Barrel) | 35.3um (+6um Barrel) |

MASKLESS EXPOSURE APPARATUS AND STITCHING EXPOSURE METHOD USING THE SAME

CROSS-REFERENCE TO RELATED APPLICATION

This application claims priority under 35 U.S.C. §119 to Korean Patent Application No. 2010-0040249, filed on Apr. 29, 2010 in the Korean Intellectual Property Office, the entire disclosure of which is incorporated herein by reference.

BACKGROUND

1. Field

Example embodiments relate to a maskless exposure apparatus to perform an exposure operation without using a mask and without generation of stitching stripes and a stitching exposure method using the same.

2. Description of the Related Art

Generally, in a method of forming a pattern on a substrate of, for example, a Liquid Crystal Display (LCD), Plasma Display Panel (PDP), or Flat Panel Display (FPD), a pattern material is first applied to the substrate and then, is selectively exposed using a photo-mask such that a part of the pattern material, chemical characteristics of which have been changed, or the remaining pattern part is selectively removed, thus completing formation of a pattern.

However, as the size of a substrate is gradually increasing and the pattern precision is rising, costs related to a photo-mask increase substantially. Therefore, a maskless exposure apparatus to form a pattern on a substrate without using a photo-mask has been developed. The maskless exposure apparatus forms a pattern by transferring an exposure beam to a substrate (for example, a glass) based on pattern information that is generated using control signals by a Spatial Light Modulator (SLM), for example, a Digital Micro-mirror Device (DMD).

In the above described maskless exposure apparatus, an exposure head is aligned by an inclination θ with respect to a scan direction (Y-axis direction), to from a beam spot array tilted from an exposure plane. The on/off state of the beam spot array is under the control of the SLM while a stage is scanned in a main-scan direction, allowing a desired pattern to be transferred to the exposure plane. This maskless exposure is performed while the stage is driven in the scan direction (Y-axis direction), and an exposure area is enlarged or reduced via operation of an optical system.

However, in the maskless exposure, the SLM used to modulate an exposure beam according to the pattern has a small size and therefore, an exposure width in a sub-scan direction (X-axis direction) covered by a single exposure head is generally about 60~70 mm even if the beam spot array is enlarged while passing through the optical system. Accordingly, in the case of a large substrate (for example, a glass having a size of 2 m or more), if an insufficient number of exposure heads cover the entire substrate, it may be necessary to perform exposure via appropriate stepping in the sub-scan direction (X-axis direction). Therefore, due to the stepping or even if the number of exposure heads is sufficient, there may exist a stitching area where exposure areas of the adjacent exposure heads overlap one another. The stitching area may cause stitching stripes according to an exposure dose.

SUMMARY

According to example embodiments, a maskless exposure apparatus includes a stage configured to move a substrate; an exposure head configured to transfer an exposure beam in a form of a beam spot array to expose a pattern on the substrate; a beam measurer configured to measure beam data of the beam spot array; a calculator configured to calculate a step distance using the measured beam data; and a controller configured to align the exposure head according to the calculated step distance and to perform stitching exposure.

According to example embodiments, the beam measurer is configured to measure beam array data including at least one of position data, power data and size data of beams constituting the beam spot array.

According to example embodiments, the calculator is configured to calculate the step distance by calculating an exposure dose in a sub-scan direction within a stitching area using the measured beam array data and to calculate an exposure dose uniformity from the calculated exposure dose.

According to example embodiments, the calculator is further configured to calculate the step distance to minimize the exposure dose uniformity in the sub-scan direction within the stitching area.

According to example embodiments, the calculator is further configured to calculate the step distance to allow the exposure dose uniformity in the sub-scan direction within the stitching area to be within a tolerance range.

According to example embodiments, the calculator is further configured to calculate the step distance using all the measured beam array data.

According to example embodiments, the calculator is further configured to calculate the step distance using at least a portion of the measured beam array data.

According to example embodiments, the exposure head includes a light source configured to emit the exposure beam; a light modulator configured to modulate the exposure beam according to an exposure pattern; and an exposure optical system configured to transfer the modulated exposure beam in the form of the beam spot array onto the substrate.

According to example embodiments, the exposure head includes a single head or multiple heads.

According to example embodiments, the multiple heads have different numbers of beam spot arrays.

According to example embodiments, a number of the beam spot arrays differs from a number of arrays of the light modulator.

According to example embodiments, the calculator is configured to calculate the step distance between the multiple heads.

According to example embodiments, the maskless exposure apparatus is configured to perform exposure by tilting the beam spot array by a rotation angle with respect to a scan direction.

According to example embodiments, a stitching exposure method of a maskless exposure apparatus includes moving a stage including a substrate in a scan direction; modulating an exposure beam according to an exposure pattern and transferring the modulated exposure beam in a form of a beam spot array to the substrate; measuring beam data of the beam spot array; calculating a step distance using the measured beam data; and performing stitching exposure by generating image data based on the calculated step distance.

According to example embodiments, measuring the beam data includes measuring beam array data including at least one of position data, power data and size data of beams constituting the beam spot array.

According to example embodiments, the calculation of the step distance includes calculating exposure dose distribution in a sub-scan direction within a stitching area using the measured beam array data; determining an exposure dose uniformity from the calculated exposure dose distribution; and calculating the step distance by determining an offset value to minimize the exposure dose uniformity.

According to example embodiments, the calculation of the step distance includes calculating exposure dose distribution in a sub-scan direction within a stitching area using the measured beam array data; determining an exposure dose uniformity from the calculated exposure dose distribution; and calculating the step distance by determining an offset value to allow the exposure dose uniformity to be within a tolerance range.

According to example embodiments, the method further includes determining a distance between multiple heads of the maskless exposure apparatus using the measured beam array data.

According to example embodiments, the method further includes aligning the multiple heads to adjust the distance between the multiple heads.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 14 is a table illustrating stitching exposure simulation conditions in the maskless exposure apparatus according to example embodiments.

DETAILED DESCRIPTION OF EXAMPLE EMBODIMENTS

Figure 1:
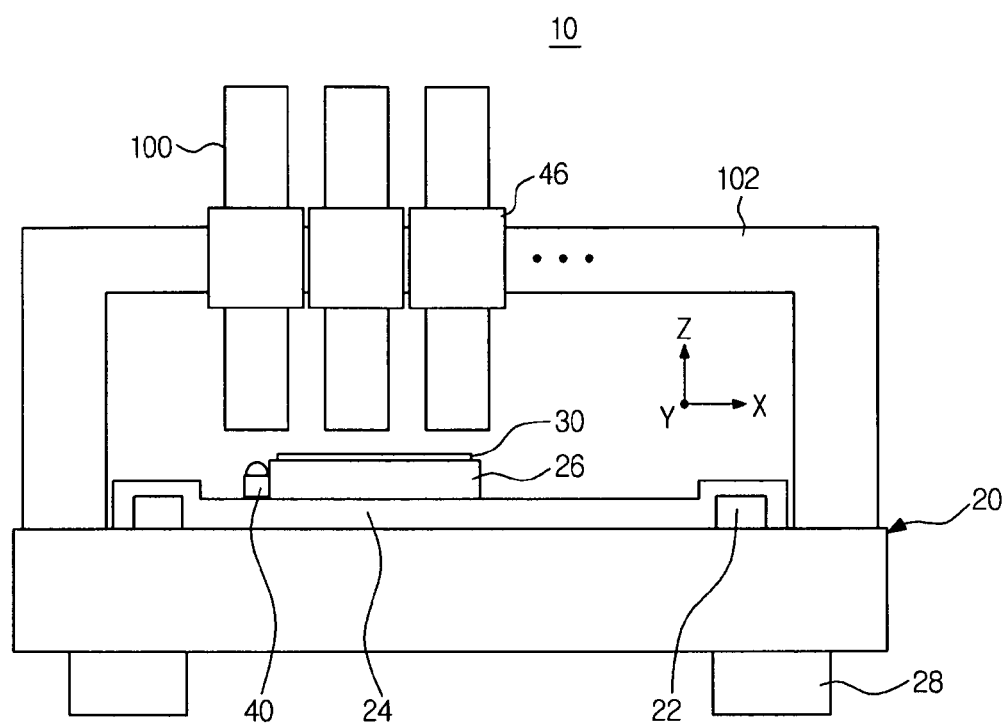
FIG. 1 illustrates a maskless exposure apparatus according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a maskless exposure apparatus according to example embodiments.

In FIG. 1, the maskless exposure apparatus 10 according to example embodiments includes a stage 20 to move a substrate to be exposed (here, the substrate is designated by reference numeral 30 and refers to all objects, such as a wafer, glass, etc., on which a predetermined/desired pattern will be formed), and an exposure head 100 to transfer an exposure beam to the substrate 30 so as to expose a photosensitive film (for example, pattern forming material) coated on the substrate 30.

The stage 20 moves the substrate 30 in an X-axis direction and a Y-axis direction and/or in a Z-axis direction. The stage 20 is provided with guides 22 and 24. The guides 22 and 24 extend in a movement direction of the stage 20 and serve to reciprocate the stage 20 in an X-axis direction (i.e. a sub-scan direction) and/or a Y-axis direction (scan direction).

The stage 20 is further provided with a chuck 26 to fix the substrate 30 to the stage 20 and also, with an isolator 28 to intercept/reduce vibrations of the stage 20.

The exposure head 100 is fixed to a stage gantry 102 and serves to irradiate an exposure beam on the substrate 30 to generate image data of a desired pattern. The exposure head 100 may include a single head or multiple heads.

Although it is described in the example embodiments that the stage 20, on which the substrate 30 is seated, is movable relative to the exposure head 100, example embodiments, are not limited thereto, and the stage 20 may be kept stationary and the exposure head 100 may be moved, or both the stage 20 and the exposure head 100 may be moved.

The maskless exposure apparatus 100 according to example embodiments further includes a beam measurer 40 to measure a position of the exposure beam irradiated from the exposure head 100 to the substrate 30.

Figure 2:
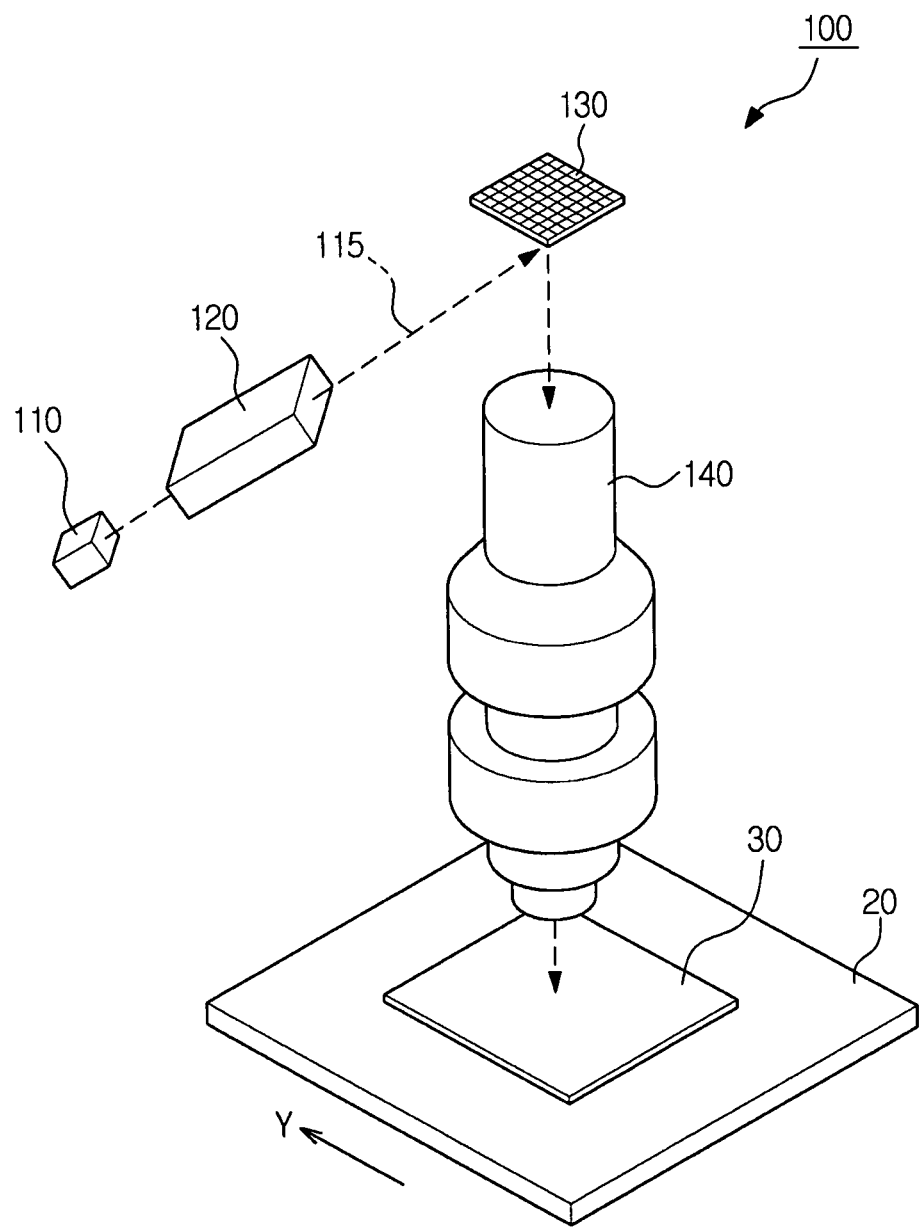
FIG. 2 illustrates some parts of the maskless exposure apparatus according to example embodiments.
Figure 3:
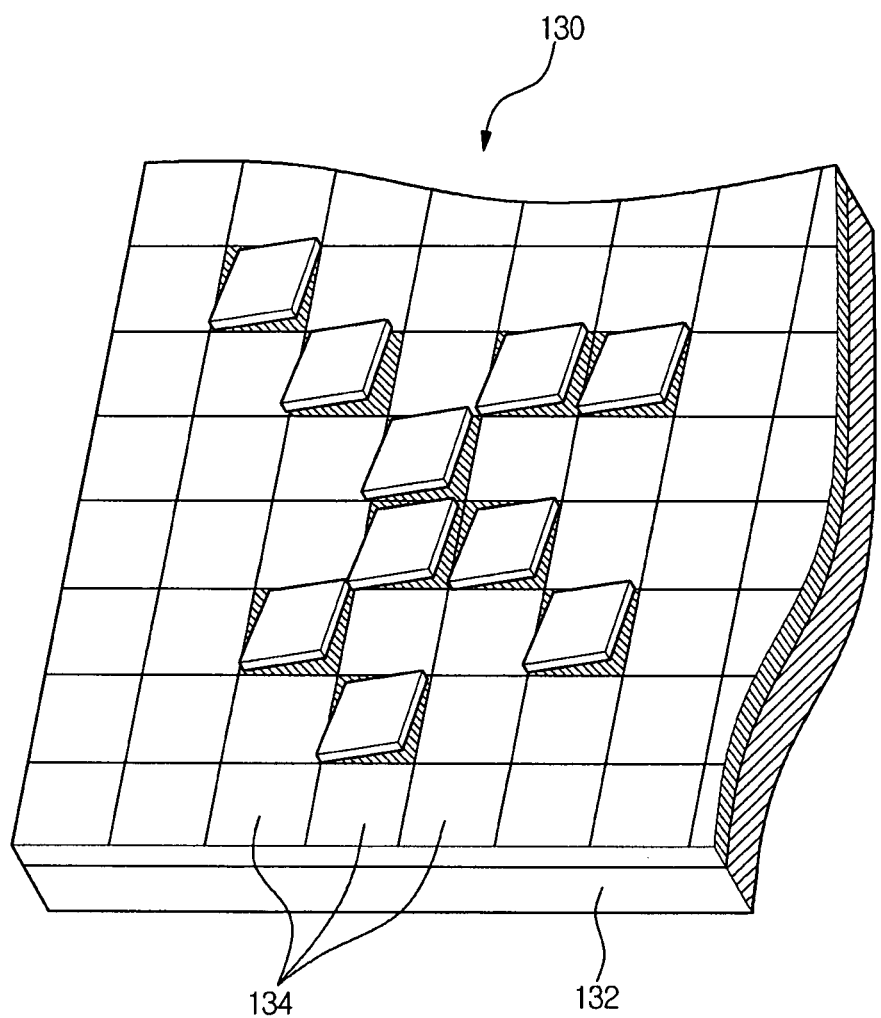
FIG. 3 illustrates a configuration of a Digital Micro-mirror Device (DMD) used in the maskless exposure apparatus according to example embodiments.

FIG. 2 illustrates some parts of the maskless exposure apparatus according example embodiments, and FIG. 3 illustrates a configuration of a Digital Micro-mirror Device (DMD) used in the maskless exposure apparatus according to example embodiments.

In FIG. 2, the exposure head 100 includes a light source 110 to emit an exposure beam 115, an illumination optical system 120 to correct a luminous intensity of the exposure beam 115 emitted from the light source 110 and emit the exposure beam 115 having a uniform luminous intensity, a light modulator 130 to modulate the exposure beam 115, having passed through the illumination optical system 120, according to pattern information (for example, the image data), and an exposure optical system 140 to allow the exposure beam 115 modulated in the light modulator 130 to be transmitted/emitted as a beam spot array to/on the substrate 30.

The light source 110 emits a beam required for exposure, and includes a semiconductor laser, ultraviolet lamp, or the like.

The light modulator 130 includes a Spatial Light Modulator (SLM). For example, the light modulator 130 may be selected from the group consisting of a Micro Electro Mechanical System (MEMS) type Digital Micro-mirror Device (DMD), two dimensional (2D) Grating Light Valve (GLV), an electro-optic device using lead zirconate titanate (PLZT) that is light transmittable ceramic, Ferroelectric Liquid Crystal (FLC), and the like. For convenience of description, it is assumed hereinafter that the light modulator 130 is a DMD.

A DMD, as illustrated in FIG. 3, refers to a mirror device including a memory cell 132 (for example, Static Random Access Memory (SRAM) cells), and a plurality of micromirrors 134 arranged in a matrix of L rows×M columns on the memory cell 132. The tilt angles of the respective micromirrors 134 differ based on control signals generated according to the image data, such that only desired light is reflected in a specific direction so as to be directed to the exposure optical system 140 and the remaining light is directed in a direction away from the exposure optical system 140.

When a digital signal is recorded in the memory cell 132 of the light modulator 130 in the form of a DMD, the micromirrors 134 are tilted in a range of a predetermined/desired angle (for example, ±12°) with respect to a diagonal line. The on/off state of each micro-mirror 134 is controlled by a head controller 48 that will be described hereinafter. If the micromirror 134 is switched on, light reflected by the micro-mirror 134 is modulated into an exposure beam to expose the substrate 30. If the micro-mirror 134 is switched off, light reflected by the micro-mirror 134 is modulated into an non-exposure beam so as not to expose the substrate 30.

Figure 4:
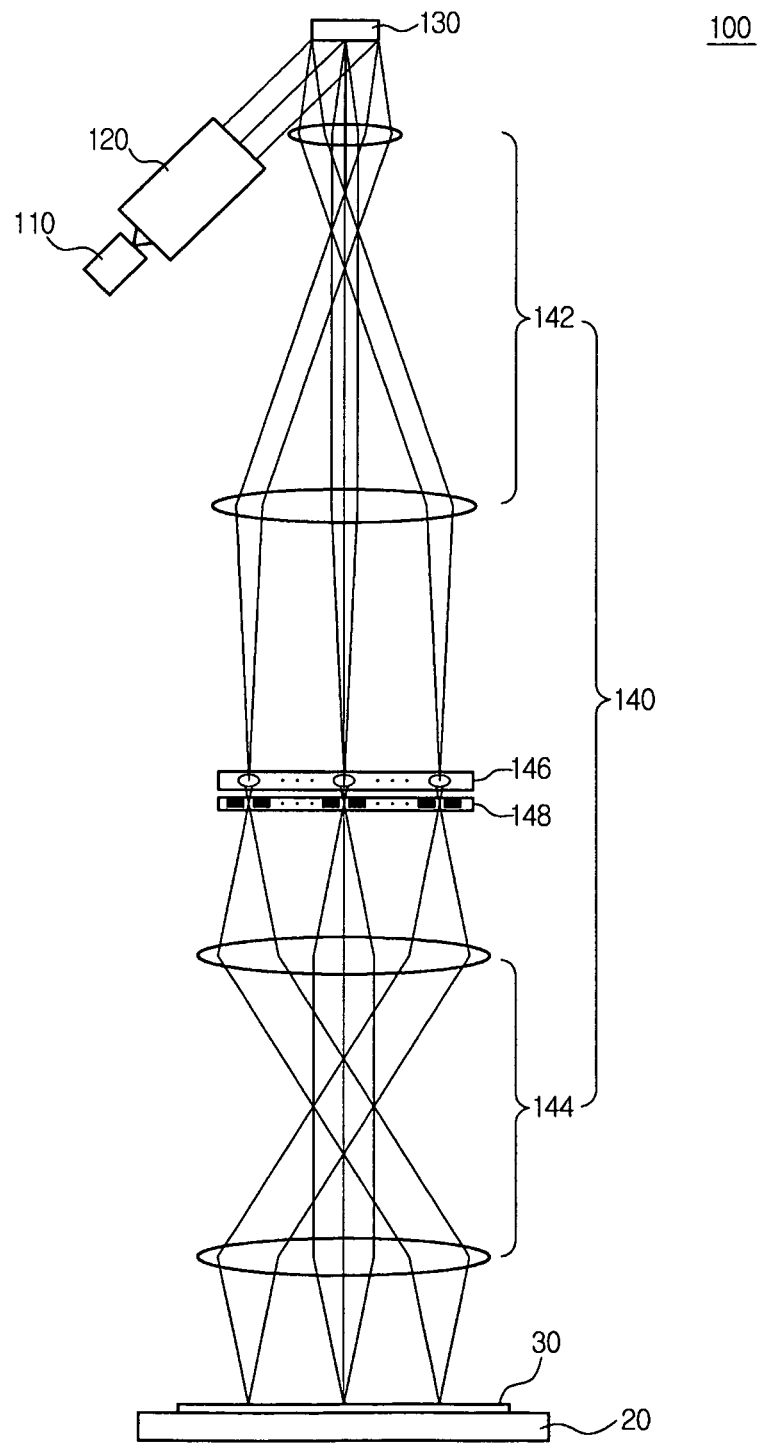
FIG. 4 is a detailed view of FIG. 2, according to example embodiments.

FIG. 4 is a detailed view of FIG. 2, according to example embodiments.

In FIG. 4, the exposure optical system 140 includes a first imaging optical system 142, a second imaging optical system 144, a micro-lens array 146, and an aperture array 148, which are arranged in a path along which the exposure beam 115 travels.

The first imaging optical system 142 is, for example, a double telecentric optical system, and forms an image that has passed through the light modulator 130 at an aperture plane of the micro-lens array 146, for example, by enlarging the image by about four times.

The second imaging optical system 144 is also, for example, a double telecentric optical system, and forms a plurality of beam spots, formed at a focal plane of the microlens array 146, on the substrate 30 by an enlargement ratio of about 1:1. Although it is described in the embodiment that the first imaging optical system 142 and the second imaging optical system 144 have magnifying powers of about 4 and 1, respectively, they are not limited thereto, and may provide an optimal combination of magnifying powers according to a desired beam spot size, minimum feature size of a pattern to be exposed, and/or the number of exposure heads 100 to be used in the maskless exposure apparatus 10.

The micro-lens array 146 is a 2D array including of a plurality of micro-lenses corresponding to the micro-mirrors of the light modulator 130. For example, if the light modulator 130 consists of 1920×400 micro-mirrors 134, the micro-lenses also have an array of 1920×400. A micro-lens pitch of the micro-lens array 146 may be substantially equal to a pitch of the micro-mirrors 134 of the light modulator 130 multiplied by the magnifying power of the first imaging optical system 142.

The aperture array 148 is a 2D array including of a plurality of pin holes arranged at the focal plane of the micro-lens array 146 at positions corresponding to the micro-lenses. The pin holes serve to shape a beam spot focused through the microlenses to a predetermined/desired size, and/or to block noise generated in the exposure optical system 140. For example, each pin hole has a diameter of about 6 μm.

Figure 5:
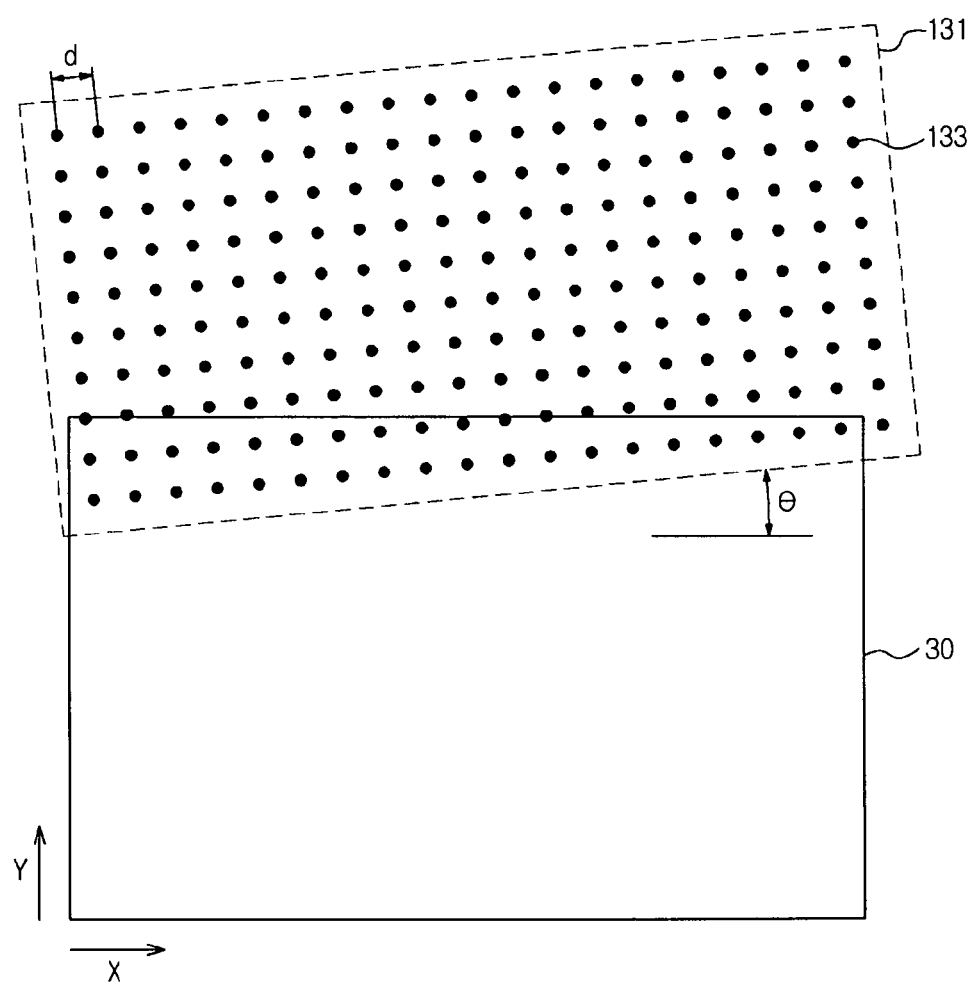
FIG. 5 is a plan view illustrating a beam spot array generated by the maskless exposure apparatus according to example embodiments.

FIG. 5 is a plan view illustrating a beam spot array generated by the maskless exposure apparatus according to example embodiments.

In FIG. 5, when the exposure beam 115 passes through the light modulator 130 and the first imaging optical system 142 and is focused onto the focal plane of the micro-lens array 146, the exposure beam 115 has a circular or elliptical shape. Then, the exposure beam 115 passes through the second imaging optical system 144 to form a beam spot array 131 on the substrate 30. The beam spot array 131 includes of a plurality of beam spots 133 arranged in a matrix. For example, the beam spots 133 have an array pitch of about 55

μm, and also, have circular Gaussian distribution with a Full Width at Half Maximum (FWHM) of about 2.5 μm.

The beam spot array 131 is tilted by a predetermined/desired alignment angle θ with respect to the scan direction (Y-axis direction). This functions to increase a resolution of the maskless exposure apparatus 10.

Figure 6:
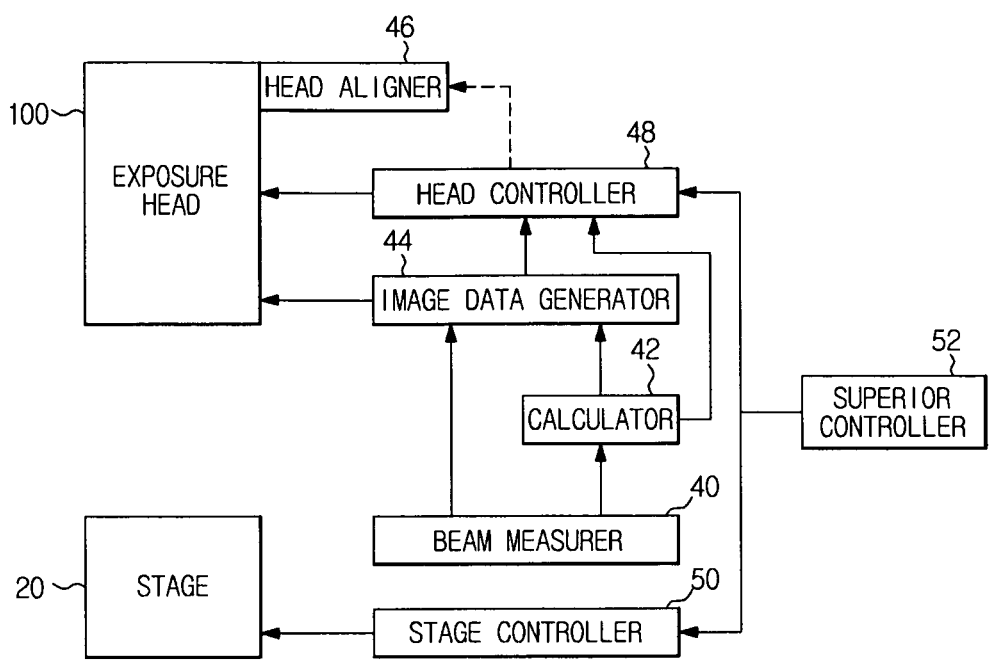
FIG. 6 is a control block diagram of the maskless exposure apparatus according to example embodiments.

FIG. 6 is a control block diagram of the maskless exposure apparatus according to example embodiments.

In FIG. 6, the maskless exposure apparatus 10 includes the beam measurer 40, calculator 42, image data generator 44, head aligner 46, head controller 48, stage controller 50, and/or superior controller 52.

The beam measurer 40 measures positions of the plurality of beam spots 133 arranged in a matrix in the beam spot array 131 formed on the substrate 30 by the exposure beam 115, and as required, measures a beam power and/or beam size of the beam spots 133.

The calculator 42 calculates exposure dose distribution X and a step distance $X_s$ using beam position data, beam power data, and/or beam size data measured by the beam measurer 40. In this case, these beam data used in calculation may be whole number data measured by the beam measurer 40, or estimated after measuring only some sample beams for the sake of expedience.

The image data generator 44 generates image data of the light modulator 130 required for exposure based on the beam data measured by the beam measurer 40 and the step distance $X_s$ calculated by the calculator 42.

The head aligner 46 performs alignment of the exposure head 100 with at least 6 degrees of freedom. In addition, the head aligner 46 performs distance alignment in the sub-scan direction (X-axis direction) if the step distance $X_s$ between one or more heads (for example, two heads) is calculated. The head aligner 46 may be configured to perform manual alignment, or automated distance alignment under assistance of the head controller 48. Although the distance alignment may be performed only via the head aligner 46, more simplified and smooth distance alignment may be performed by switching off some rows of the micro-mirrors 134 located at opposite ends of the light modulator 130.

The head controller 48 serves to control the light modulator 130, light source 110, and/or focusing unit in the exposure head 100, in addition to the alignment of the exposure head 100.

The stage controller 50 serves to control movement of the stage 20.

The superior controller 52 is a main controller to control general operations of the maskless exposure apparatus 10, and gives the head controller 48 and the stage controller 50 a command to perform exposure.

Hereinafter, the maskless exposure apparatus having the above described configuration and operational sequence and effects of a stitching exposure method using the same will be described.

First, the substrate 30 is placed on the stage 20 and is fixed by use of the chuck 26.

The one or more exposure heads 100 are installed to the stage gantry 102 above the stage 20 and irradiate the exposure beam 115 to the substrate 30 to expose a desired pattern shape on the substrate 30.

The exposure head 100 includes the light modulator 130 to modulate the exposure beam 115 based on a desired pattern shape, thus allowing the modulated exposure beam 115 to form the beam spot array 131 on the substrate 30 (See FIG. 5).

In the maskless exposure apparatus 10 to perform exposure by tilting the beam spot array 131, which has been formed on the substrate 30 by the exposure beam 115, by a predetermined/desired rotation angle θ with respect to the scan direction (Y-axis direction), the exposure is performed when the stage 20 is driven in the scan direction (Y-axis direction).

In the maskless exposure apparatus 10, since the light modulator 130 serving to modulate the exposure beam 115 based on the pattern has a small size, an exposure width in the sub-scan direction (X-axis direction) covered by the single exposure head 100 is generally in a range of 60~70 mm even if an area of the beam spot array 131 is enlarged while the exposure beam 115 passes through the exposure optical system 140.

Accordingly, if the substrate 30 has a large size (for example, 2 m or more), the number of the exposure heads 100 may be insufficient to cover the entire substrate 30, and the exposure heads 100 may be subjected to appropriate stepping in the sub-scan direction (X-axis direction) during exposure. Due to the stepping or even if the number of the exposure heads 100 is sufficient, there may exist a stitching area where exposure areas of the adjacent exposure heads 100 overlap each other.

In maskless exposure, if an exposure dose of the stitching area greatly differs from that of a non-stitching area, this may have a direct effect on a pattern line width and Line Edge Roughness (LER). Thus, the stitching area may be visible with the naked eye as stripes. Since the resulting stitching stripes still remain as defects even when a completely fabricated Liquid Crystal Display (LCD) is operated, it may be important to realize exposure without generation of stitching stripes.

Assuming an ideal exposure head 100, there is a theoretical step distance $X_s$ to achieve a uniform exposure dose even in the stitching area. This will be described hereinafter with reference to FIG. 7.

Figure 7:
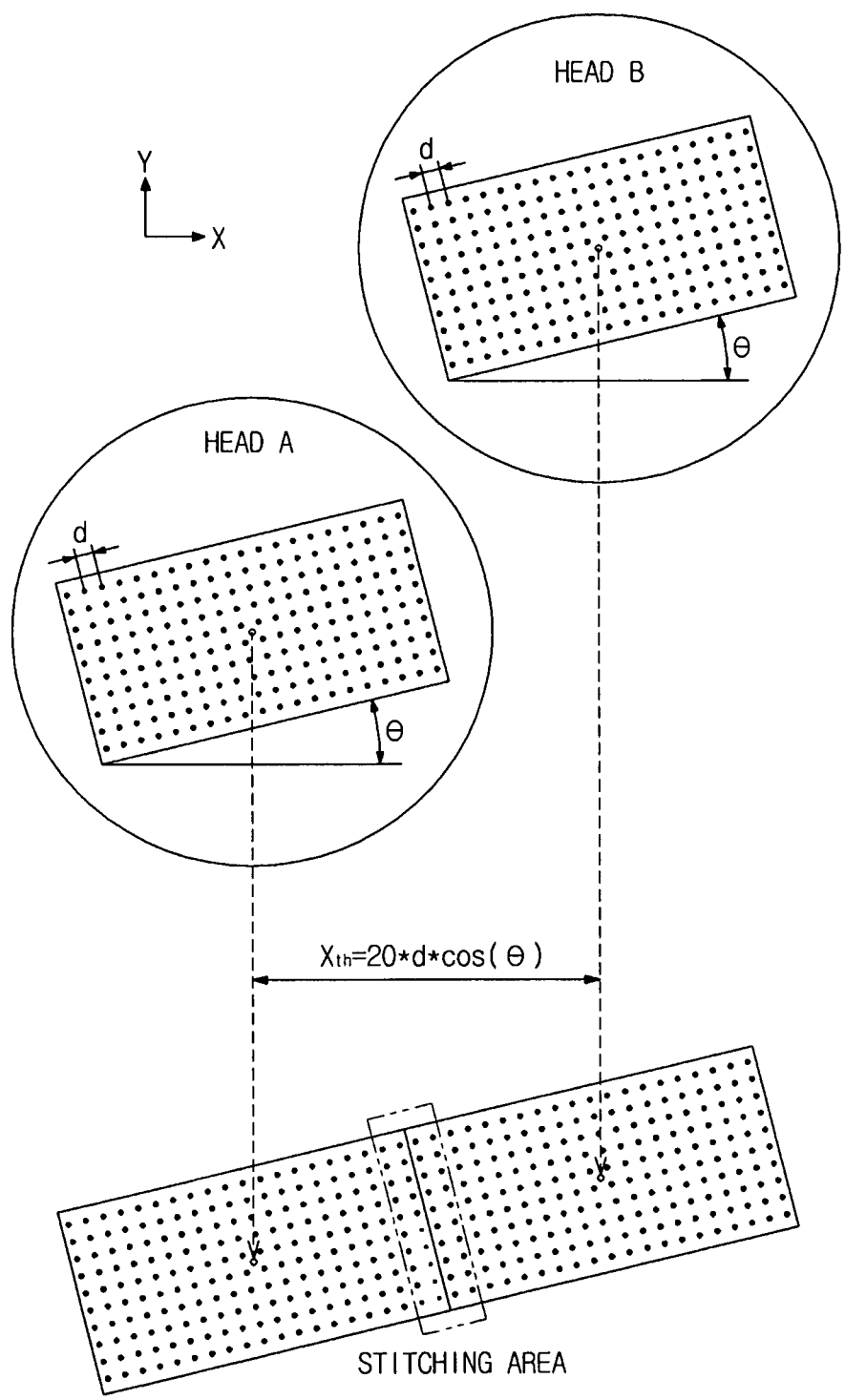
FIG. 7 illustrates a stitching area generated by an ideal exposure head of the maskless exposure apparatus according to example embodiments.

FIG. 7 illustrates a stitching area generated by an ideal exposure head of the maskless exposure apparatus according to example embodiments. For convenience of description, the following description is based on the case in which two exposure heads 100 (i.e. head A and head B) are used.

In FIG. 7, if the head A and the head B, each containing the beam spot array 131 of 20×10, have the same beam distance d and the same rotation angle θ, and all the beam spots 133 have the same beam size and/or beam power, a geometrical step distance $X_{th}$ has a value of 20*d*cos(θ) (here, 20 is the number of columns of the beam spot array 131). Under the condition of the step distance $X_{th}$, it may be difficult to discriminate the stitching area designated by a dash-dot box, and it seems that there is a single beam spot array 131 of 40×10.

However, the theoretical step distance Xs may not be applicable in actual/non-ideal stitching exposure. In the case of the actual exposure head 100, for example, an aberration and/or fabrication error of the exposure optical system 140 may cause a difference in beam distance in a single exposure head 100 and beam distances between two exposure heads 100 and also, may cause non-uniform distribution in the beam size and beam power of the beam spots 133. In addition, it may be difficult to align two or more exposure heads 100 to have the same rotation angle θ. This will be described hereinafter with reference to FIG. 8.

Figure 8:
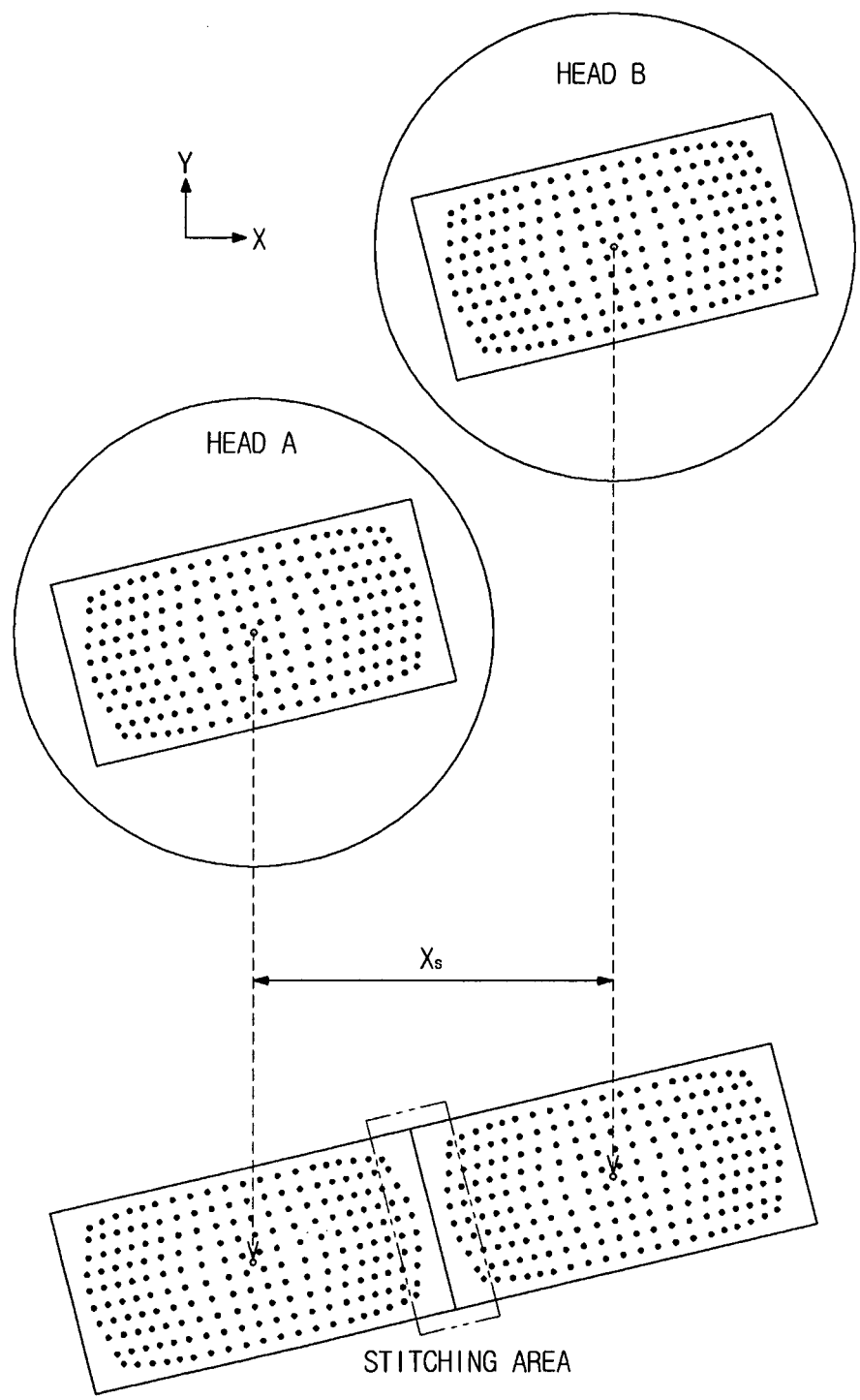
FIG. 8 illustrates a stitching area generated by an actual/non-ideal exposure head of the maskless exposure apparatus according to example embodiments.

FIG. 8 illustrates a stitching area generated by an actual/non-ideal exposure head of the maskless exposure apparatus according to example embodiments. For convenience of description, the following description is based on the case in which two exposure heads 100 (i.e. head A and head B) are used.

FIG. 8 illustrates an exaggerated example in which the head A and the head B have different beam distances d due to distortion of the exposure optical system 140. Considering the stitching area designated by a dash-dot box, an exposure dose is not uniform under the condition of $X_s = X_{th}$, and thus, generation of stitching stripes may be expected.

Determining the step distance $X_s$ using an experimental method may consume a considerably long time. This is because it may be necessary to repeatedly generate image data of the light modulator 130 on a per changed step distance $X_s$ basis, and after performing actual exposure/developing processes, to determine the step distance $X_s$ suitable to minimize stitching stripes by comparing the image data by use of a microscope and/or with the naked eye. Moreover, since exposure dose uniformity in the stitching area greatly varies according to the step distance $X_s$, it may be necessary to perform repeated experiments on a per finely divided step distance $X_s$ basis. Although replacing the experiments with an exposure simulation may be attempted, the exposure simulation may also consume a long calculation time and thus, time saving effects are minimal.

For this reason, to perform exposure without generation of stitching stripes, in example embodiments, the step distance $X_s$, in which exposure dose uniformity in the stitching area is within a tolerance range, is determined by use of actual position data of the beam spots 133 constituting the beam spot array 131 on an exposure plane, and then, exposure is performed based on image data conforming to the step distance $X_s$. In addition, if necessary, the step distance $X_s$, in which exposure dose uniformity in the stitching area is within a tolerance range, may be determined even by use of the beam power data and/or beam size data of the beam spots 133.

Hereinafter, a method of calculating the step distance using the data of the beam spots 133 will be described with reference to FIG. 9.

Figure 9:
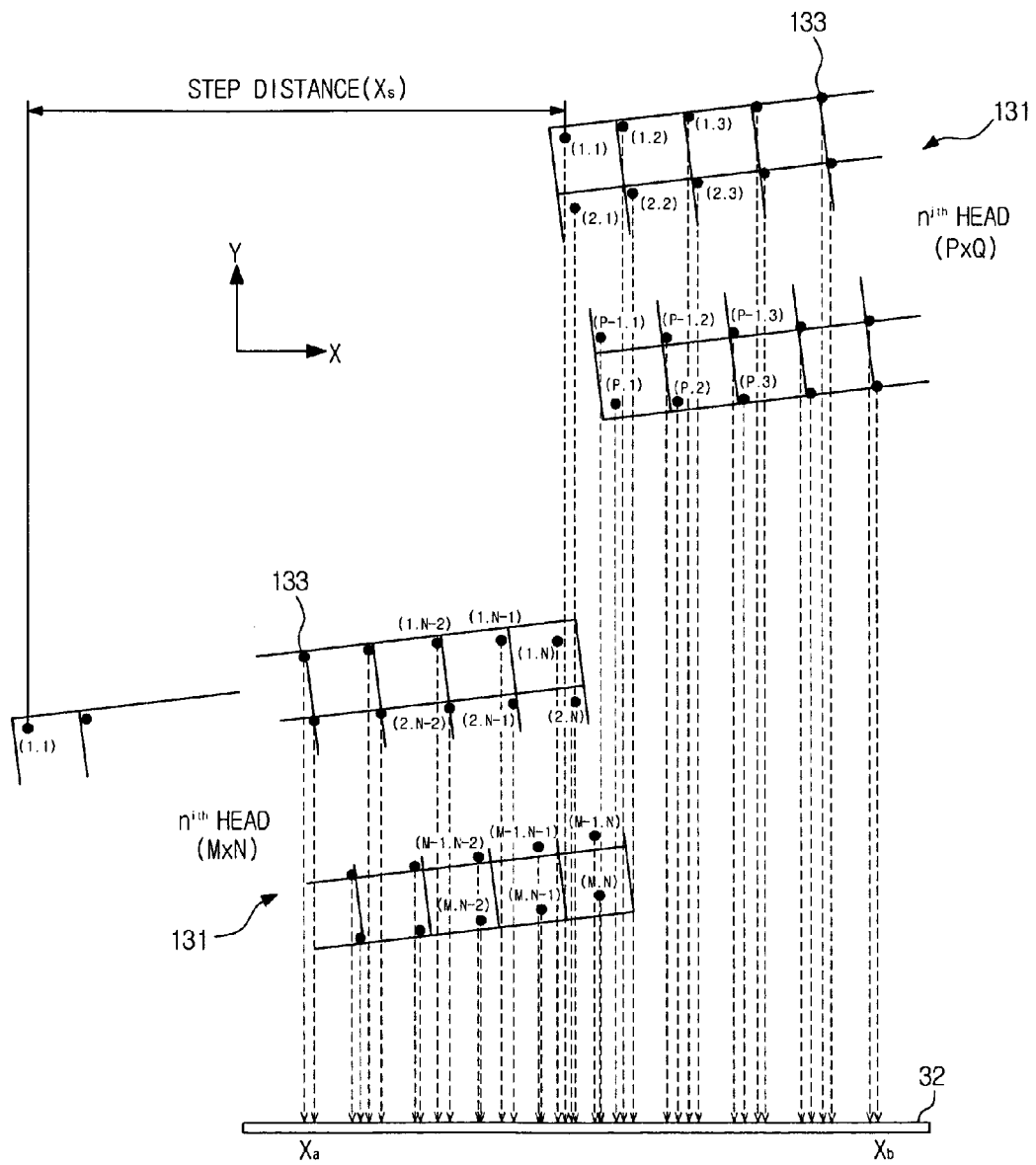
FIG. 9 illustrates a step distance calculating method using beam spot data to enable stitching exposure in the maskless exposure apparatus according to example embodiments.

FIG. 9 illustrates a step distance calculating method using beam spot data to enable stitching exposure in the maskless exposure apparatus according to example embodiments. Here, reference character $X_s$ represents a step distance between adjacent heads.

In FIG. 9, if it is assumed that an $n^{ith}$ head contains the beam spot array 131 of M rows×N columns on an exposure plane and an adjacent $n^{jth}$ head contains the beam spot array 131 of P rows×Q columns, exposure dose distribution X in the sub-scan direction (X-axis direction) near the stitching area may be calculated by the following Equation 1 using position data of the respective beam spots 133.

As illustrated in FIG. 9, if it is assumed that all the beam spots 133 move in the scan direction (Y-axis direction) in an on state thereof, Equation 1 may be utilized to calculate exposure dose distribution applied to an imaginary slit 32 located in the sub-scan direction (X-axis direction).

In addition, since each exposure head 100 may switch on or off some rows or columns of the light modulator 130, the number of the beam spot arrays 131 on the exposure plane may differ from the number of arrays of the light modulator 130, and likewise, the adjacent exposure heads 100 may have different numbers of arrays.

$$\text{Dose}(X) = \sum_{m=1}^{M}\sum_{n=a}^{N} S(X - X^i_{(m,n)}) + \sum_{p=1}^{P}\sum_{q=1}^{Q} S(X - X^j_{(p,q)} - X_{offset}) \quad \text{Equation 1}$$

In the above Equation 1, S(X) represents a profile of the beam spots 133, $X^i_{(m,n)}$ represents an X position of an (m, n) spot of the $n^{ith}$ head, $X^j_{(p,q)}$ represents an X position of a (p, q) spot of the $n^{jth}$ head, and $X_{offset}$ represents an offset distance between heads additionally required to prevent stitching stripes. When an appropriate section (Xa, Xb) including the stitching area is set to use only data of the beam spots 133 within the section (Xa, Xb), calculation time may be reduced. Indices "a" and "b" represent limits of the section.

Exposure dose uniformity may be calculated from exposure dose distribution X of Equation 1.

Figure 10:
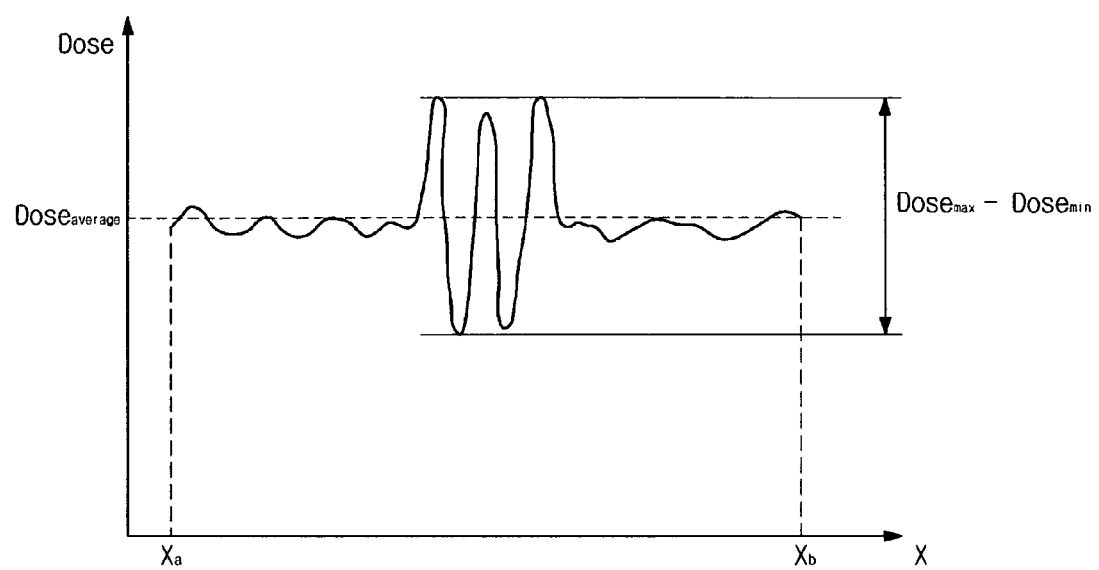
FIG. 10 is a graph illustrating exposure dose distribution of the stitching area in the maskless exposure apparatus according to example embodiments.

FIG. 10 is a graph illustrating exposure dose distribution of the stitching area calculated from Equation 1 in the maskless exposure apparatus according to example embodiments.

In FIG. 10, exposure dose uniformity may be calculated from the following Equation 2.

$$\text{Uniformity}(\%) = \frac{Dose_{max} - Dose_{min}}{Dose_{average}} \times 100 \quad \text{Equation 2}$$

Figure 11:
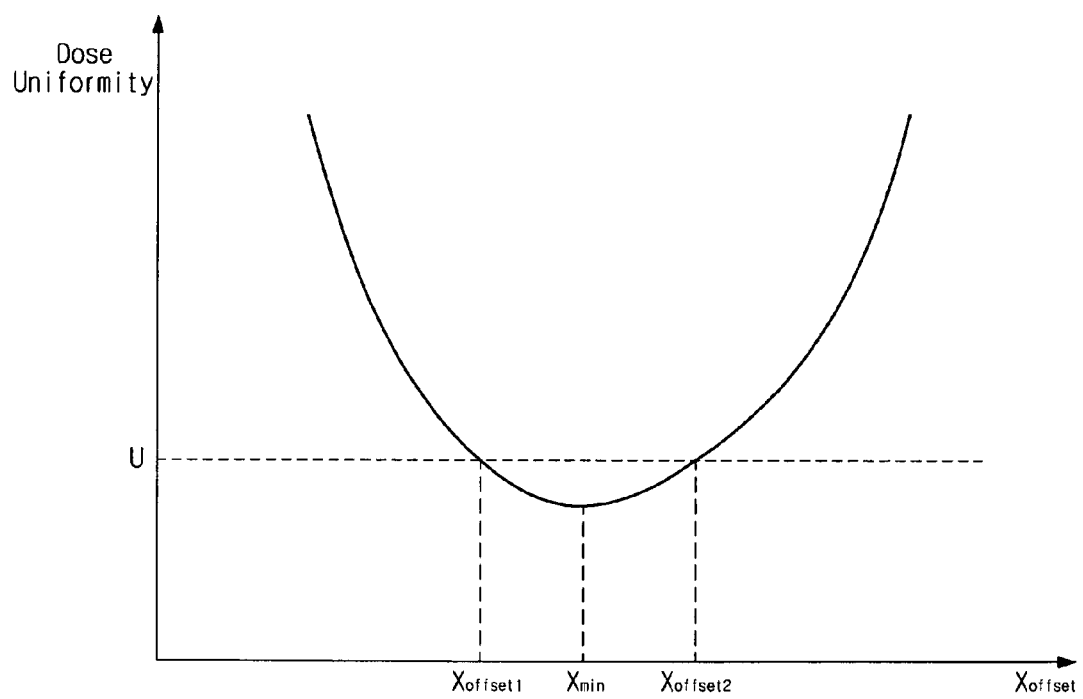
FIG. 11 is a graph illustrating variation of exposure dose uniformity depending on an offset distance between heads of the maskless exposure apparatus according to example embodiments.

FIG. 11 is a graph illustrating variation of exposure dose uniformity depending on an offset distance between heads of the maskless exposure apparatus according to example embodiments.

In FIG. 11, it may be attempted to vary the offset distance $X_{offset}$ between heads additionally required to prevent stitching stripes, so as to determine a minimum value $X_{min}$ of expose dose uniformity as represented in the following Equation 3, or so as to determine an appropriate value range of $X_{offset1} \sim X_{offset2}$ within a tolerance range U as represented in the following Equation 4.

$$\underset{X_{offset}}{\text{minimize Uniformity}}(X_{offset}) \quad \text{Equation 3}$$

$$\underset{X_{offset}}{\text{find Uniformity}}(X_{offset}) < U \quad \text{Equation 4}$$

Accordingly, since stitching exposure using a single head satisfies $X^i_{(m,n)} = X^j_{(p,q)}$, the step distance $X_s$ is equal to the offset distance $X_{offset}$. In the case of stitching exposure using two different heads, the step distance $X_s$ may be calculated by the following Equation 5 by way of example.

$$X_s = (X^j_{(1,1)} - X^i_{(1,1)}) + X_{offset} \quad \text{Equation 5}$$

If the beam power and/or beam size of the beam spots 133 is sufficiently uniform, exposure dose distribution X may be calculated from the following Equation 6 by use of beam power data and/or beam size data as well as beam position data.

$$\text{Dose}(X) = \sum_{m=1}^{M}\sum_{n=a}^{N} P^i_{(m,n)} \cdot S^i_{(m,n)}(X - X^i_{(m,n)}) + \\ \sum_{p=1}^{P}\sum_{q=1}^{Q} P^j_{(p,q)} \cdot S^j_{(p,q)}(X - X^j_{(p,q)} - X_{offset}) \quad \text{Equation 6}$$

In Equation 6, $X^i_{(m,n)}$ represents an X position of an (m, n) spot of the $n^{ith}$ head, $X^j_{(p,q)}$ represents an X position of a (p, q) spot of the $n^{jth}$ head, $P^i_{(m,n)}$ represents a beam power of an (m, n) spot of the $n^{ith}$ head, $P^j_{(p,q)}$ represents a beam power of a (p, q) spot of the $n^{jth}$ head, $S^i_{(m,n)}$ represents a beam size of an (m, n) spot of the $n^{ith}$ head, $S^j_{(p,q)}$ represents a beam size of a (p, q) spot of the $n^{jth}$ head, and $X_{offset}$ represents an offset distance between heads additionally required to prevent stitching stripes. When an appropriate section (Xa, Xb) including the stitching area is set to use only data of the beam spots 133 within the section (Xa, Xb), calculation time may be reduced. Indices "a" and "b" represent limits of the section.

As will be appreciated from Equation 6, a more accurate step distance $X_s$ may be calculated by use of beam position data, beam power data and/or beam size data of the beam spots 133.

The above mentioned method of calculating the step distance $X_s$ is applicable to all maskless exposure apparatuses that perform stitching exposure. FIGS. 12A to 12D illustrate several example embodiments.

FIGS. 12A to 12D are views illustrating different example embodiments of an exposure head arrangement in which the step distance calculating method of the maskless exposure apparatus according to example embodiments is applicable.

Figure 12A:
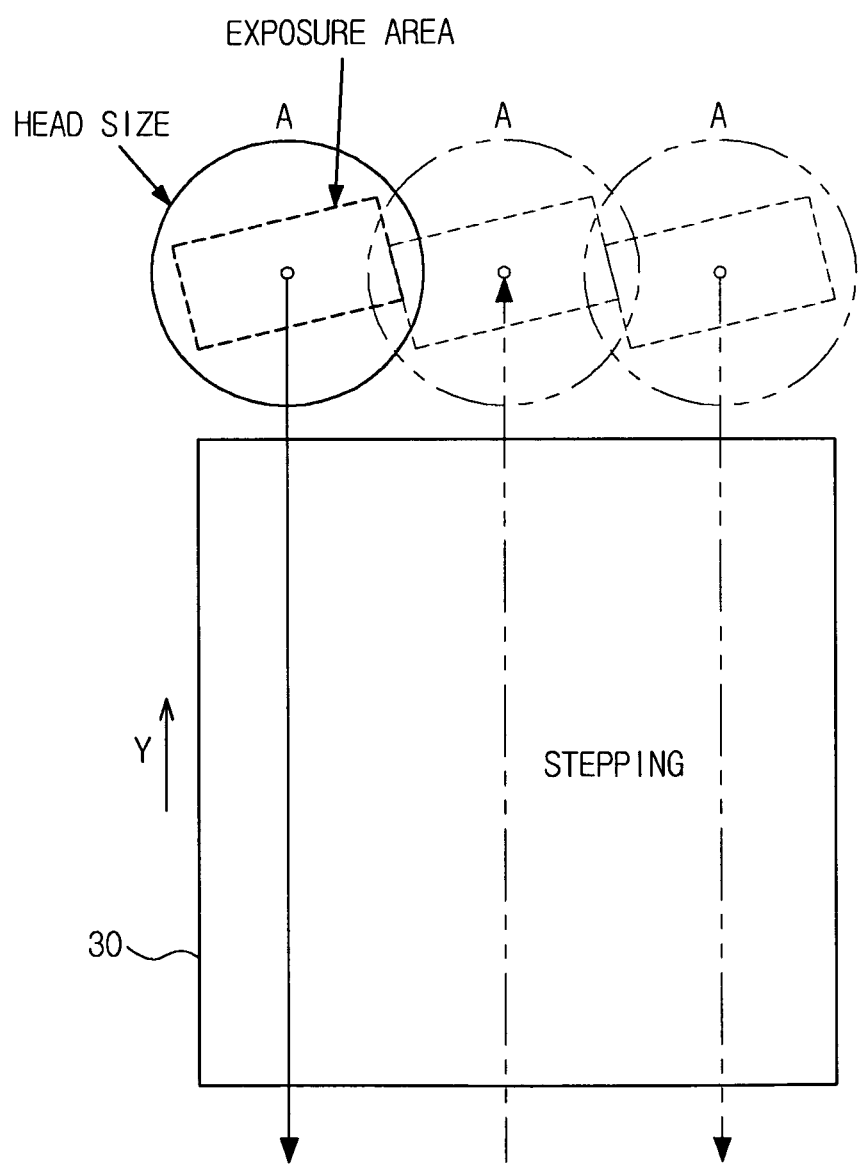
FIGS. 12A to 12D are views illustrating different embodiments of an exposure head arrangement in which the step distance calculating method of the maskless exposure apparatus according to example embodiments is applied.

FIG. 12A illustrates a case in which the maskless exposure apparatus 10 including a single head A performs stitching exposure.

In FIG. 12A, the step distance $X_s$ may be calculated using position data of the beam spots 133 in the right field of the head A (i.e. right field data) and position data of the beam spots 133 in the left field of the head A (i.e. left field data).

Figure 12B:
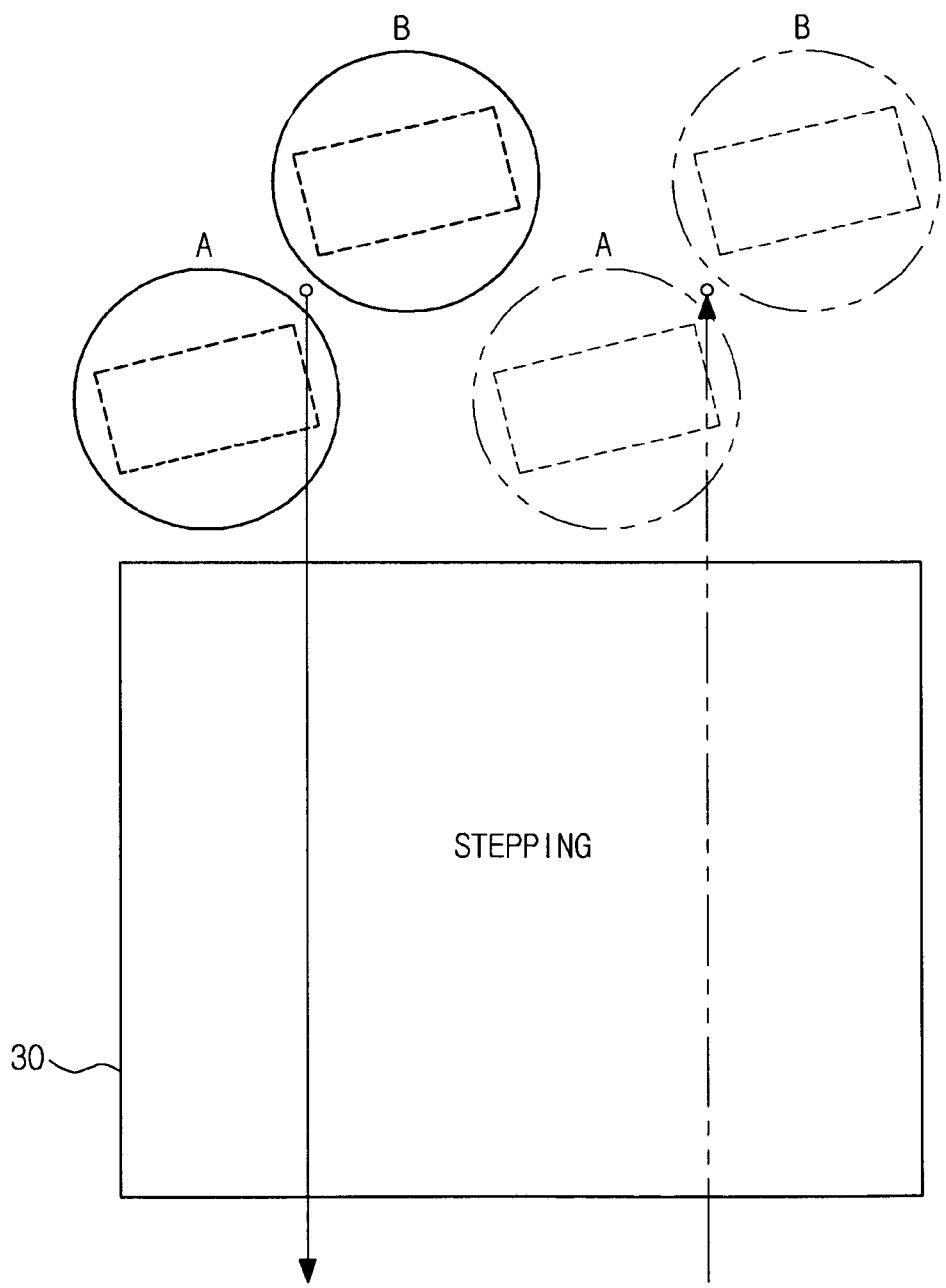

FIG. 12B illustrates a case in which the maskless exposure apparatus 10 including two heads A and B performs stitching exposure.

In FIG. 12B, the step distance $X_s$ between the heads A and B may be calculated using right field data of the head A and left field data of the head B, and a stepping distance required for stepping exposure may be calculated using left field data of the head A and right field data of the head B.

Figure 12C:
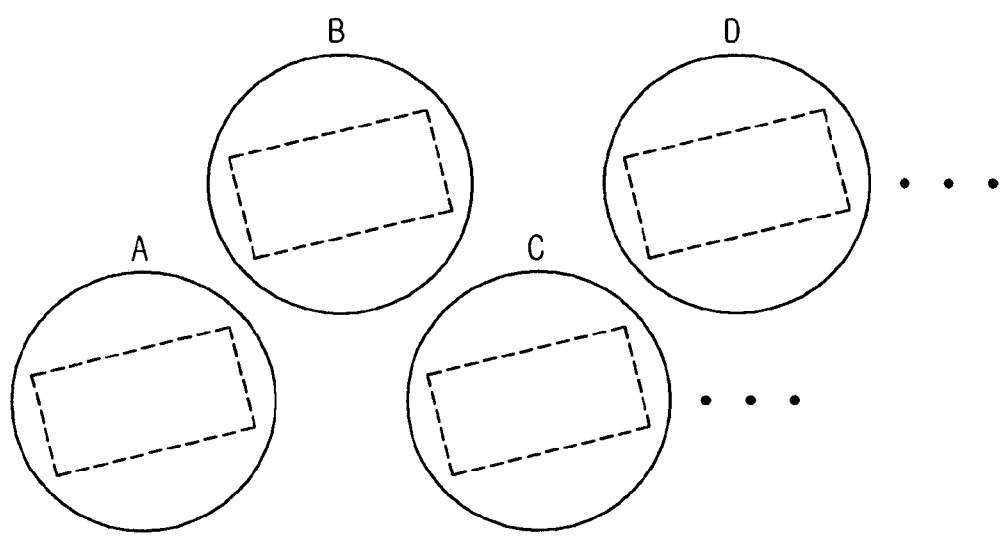
Figure 12D:
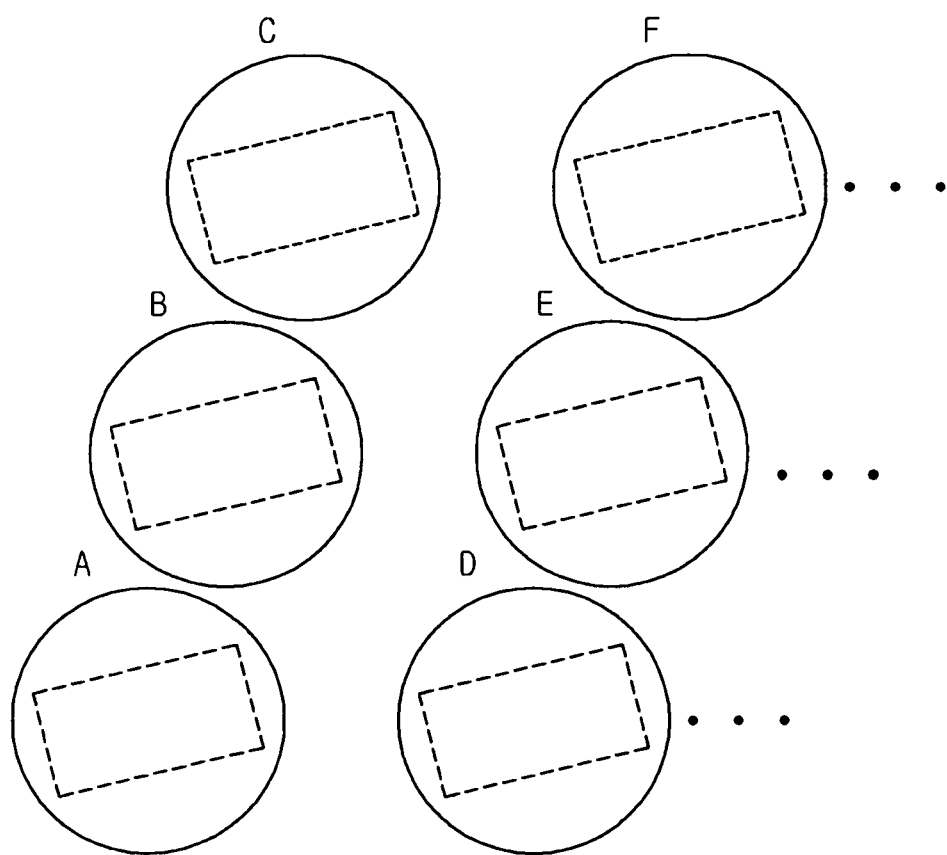

FIG. 12C illustrates a case in which the maskless exposure apparatus 10 including heads arranged in two rows performs stitching exposure, and FIG. 12D illustrates a case in which the maskless exposure apparatus 10 including heads arranged in three rows performs stitching exposure. In each case, the number of heads may be determined according to the size of the substrate 30.

In FIG. 12C, the step distance $X_s$ may be calculated, for example, using a combination of the head A and the head B, of the head B and the head C, and of the head C and the head D in sequence. If the exposure head 100 has a larger diameter than a field size, or the head aligner 46 has a large size, as illustrated in FIG. 12D, the heads may be arranged in three or more rows. In this case, the method of calculating the step distance $X_s$ may be applied in the same manner.

Figure 13:
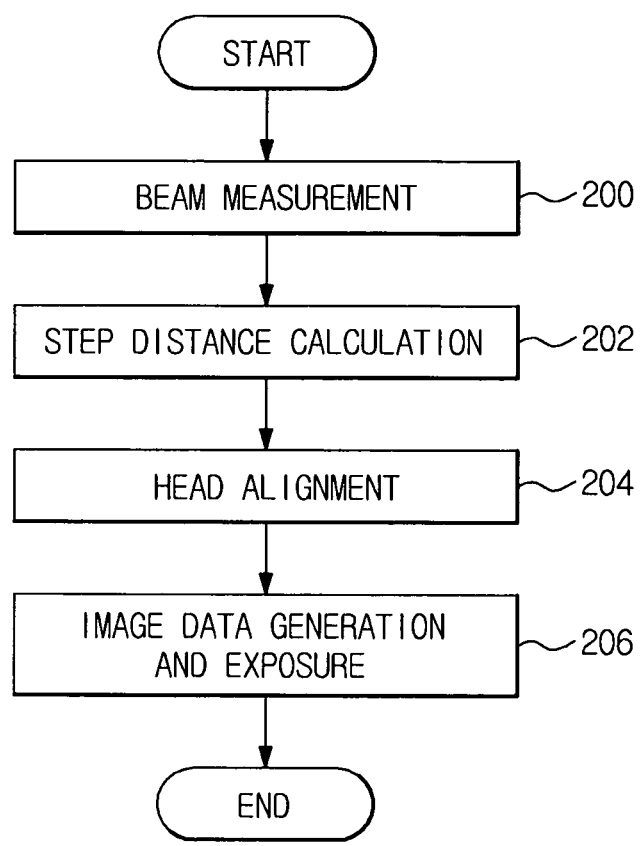
FIG. 13 is a flow chart illustrating the operation sequence of a control method to perform stitching exposure in the maskless exposure apparatus according to example embodiments.

FIG. 13 is a flow chart illustrating the operation sequence of a control method to perform stitching exposure in the maskless exposure apparatus according to example embodiments.

In FIG. 13, as the stage 20, to which the substrate 30 has been fixed, is moved in the scan direction (Y-axis direction), the exposure beam 115 irradiated from the light source 110 of the exposure head 100 is modulated based on an exposure pattern via the light modulator 130 and then, the modulated exposure beam 115 is transferred to the substrate 30 to form the beam spot array 131.

The beam measurer 40 measures the beam spots 133 of the beam spot array 131, for example, beam array data (200). The beam array data may basically include beam position data and, if necessary, may include beam power data and/or beam size data.

The calculator 42 calculates the step distance $X_s$ using the beam position data, beam power data and/or beam size data measured by the beam measurer 40 (202). The head aligner 46 aligns the exposure head 100 in the sub-scan direction (X-axis direction) according to the calculated step distance $X_s$ (204).

Thereafter, the image data generator 44 generates image data of the light modulator 130 required for exposure based on the step distance $X_s$ calculated by the calculator 42 and the beam data measured by the beam measurer 40. The head controller 48 controls the light modulator 130, light source 110, and/or focusing unit, of the light modulator 100, enabling exposure of the substrate, in addition to alignment of the exposure head 100.

An exposure simulation was performed to show that negligible stitching stripes occur when using a stitching exposure method according to example embodiments. Simulation conditions were assumed as illustrated in FIG. 14.

FIG. 14 is a table illustrating stitching exposure simulation conditions in the maskless exposure apparatus according to example embodiments.

As illustrated in FIG. 14, the head A and the head B differ in the number of rows of the beam spot array 131, rotation alignment angle, and barrel distortion. In addition, it was assumed that each beam is a Gaussian beam with a Full Width at Half Maximum (FWHM) of 2.6 μm.

Variation of exposure dose distribution in the stitching area was observed while adding an offset distance $X_{offset}$ to a head distance of 67.774103 mm=0.0353*1920/2*(cos(0.42971°)+cos(0.42771°)) in a theoretical X-axis direction (stepping direction) on the basis of the centers of the head A and the head B. As a result of calculating variation of exposure dose uniformity from the variation of exposure dose distribution, it was found that the best result is obtained at −10.7 μm. Thereby, the required step distance $X_s$ between the centers of the heads A and B was calculated to be 67.763403 mm. For reference, on the basis of a (1, 1) spot of each head, the step distance is 67.764352 mm. This difference in the step distances is induced by different distortions of both the heads.

Figure 15A:
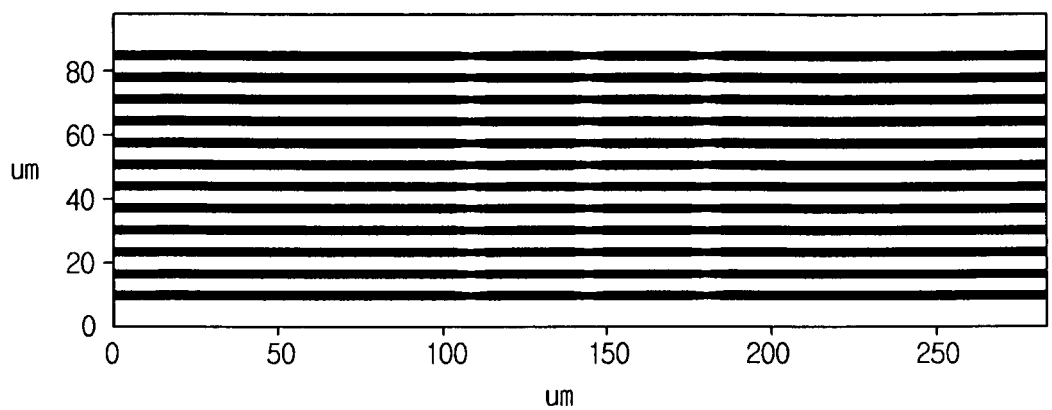
FIGS. 15A and 15B are views comparing an image of the stitching area of the maskless exposure apparatus according to example embodiments with a related art image.
Figure 15B:
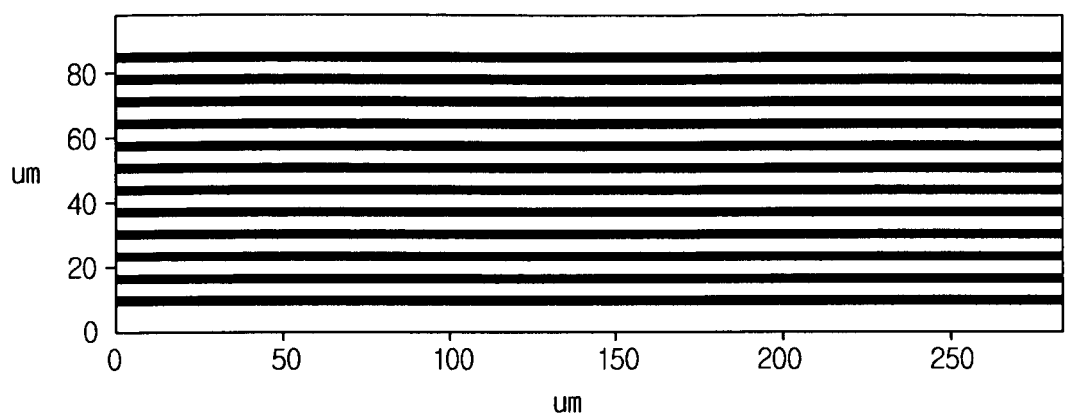

FIGS. 15A and 15B are views comparing an aerial image in the stitching area of the maskless exposure apparatus according to example embodiments with a related art image. There are illustrated exposure aerial images in the stitching area with respect to a 3.5 μm/space pattern.

FIG. 15A illustrates a case based on the theoretical step distance (67.774103 mm). In FIG. 15A, there exists an insufficient exposure dose area in which a line width gradually decreases and thus, advent of stitching stripes may be expected.

On the other hand, FIG. 15B illustrates a case in which the step distance $X_s$ is calculated in the method proposed in example embodiments, and it may be seen that the stitching area exhibits a relatively uniform exposure dose without stitching stripes.

As apparent from the above description, with a maskless exposure apparatus and a stitching exposure method using the same according to example embodiments, it may be possible to determine a step distance, in which exposure dose uniformity in a stitching area is within a tolerance range, by use of actual position data of beam spots constituting a beam spot array on an exposure plane, and if necessary, by use of beam power data and/or beam size data. As exposure is performed based on image data conforming to the step distance, even the stitching area has a uniform exposure dose, resulting in exposure without stitching stripes.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A maskless exposure apparatus, comprising:
a stage configured to move a substrate;

an exposure head configured to transfer an exposure beam in a form of a beam spot array to expose a pattern on the substrate;
a beam measurer configured to measure beam data of the beam spot array;
a calculator configured to calculate a step distance using the measured beam data; and
a controller configured to linearly align the exposure head according to the calculated step distance and to perform stitching exposure.

2. The apparatus according to claim 1, wherein the beam measurer is configured to measure beam array data including at least one of position data, power data and size data of beams constituting the beam spot array.

3. The apparatus according to claim 2, wherein the calculator is configured to calculate the step distance by calculating an exposure dose in a sub-scan direction within a stitching area using the measured beam array data and to calculate an exposure dose uniformity from the calculated exposure dose.

4. The apparatus according to claim 3, wherein the calculator is further configured to calculate the step distance to minimize the exposure dose uniformity in the sub-scan direction within the stitching area.

5. The apparatus according to claim 3, wherein the calculator is further configured to calculate the step distance to allow the exposure dose uniformity in the sub-scan direction within the stitching area to be within a tolerance range.

6. The apparatus according to claim 3, wherein the calculator is further configured to calculate the step distance using all the measured beam array data.

7. The apparatus according to claim 3, wherein the calculator is further configured to calculate the step distance using at least a portion of the measured beam array data.

8. The apparatus according to claim 1, wherein the exposure head includes:
a light source configured to emit the exposure beam;
a light modulator configured to modulate the exposure beam according to an exposure pattern; and
an exposure optical system configured to transfer the modulated exposure beam in the form of the beam spot array onto the substrate.

9. The apparatus according to claim 8, wherein the exposure head includes a single head or multiple heads.

10. The apparatus according to claim 9, wherein the multiple heads have different numbers of beam spot arrays.

11. The apparatus according to claim 9, wherein a number of the beam spot arrays differs from a number of arrays of the light modulator.

12. The apparatus according to claim 10, wherein the calculator is configured to calculate the step distance between the multiple heads.

13. The apparatus according to claim 1, wherein the maskless exposure apparatus is configured to perform exposure by tilting the beam spot array by a rotation angle with respect to a scan direction.

14. A stitching exposure method of a maskless exposure apparatus, the method comprising:
moving a stage including a substrate in a scan direction;
modulating an exposure beam according to an exposure pattern and transferring the modulated exposure beam in a form of a beam spot array to the substrate;
measuring beam data of the beam spot array;
calculating a step distance using the measured beam data;
linearly aligning an exposure head of the maskless exposure apparatus according to the calculated step distance, and
performing stitching exposure by generating image data based on the calculated step distance.

15. The method according to claim 14, wherein measuring the beam data includes measuring beam array data including at least one of position data, power data and size data of beams constituting the beam spot array.

16. The method according to claim 15, wherein the calculation of the step distance includes:
calculating exposure dose distribution in a sub-scan direction within a stitching area using the measured beam array data;
determining an exposure dose uniformity from the calculated exposure dose distribution; and
calculating the step distance by determining an offset value to minimize the exposure dose uniformity.

17. The method according to claim 15, wherein the calculation of the step distance includes:
calculating exposure dose distribution in a sub-scan direction within a stitching area using the measured beam array data;
determining an exposure dose uniformity from the calculated exposure dose distribution; and
calculating the step distance by determining an offset value to allow the exposure dose uniformity to be within a tolerance range.

18. The method according to claim 15, further comprising determining a distance between multiple heads of the maskless exposure apparatus using the measured beam array data.

19. The method according to claim 18, further comprising aligning the multiple heads to adjust the distance between the multiple heads.

20. A maskless exposure apparatus, comprising:
a stage configured to move a substrate;
first and second exposure heads configured to transfer exposure beams in a form of beam spot arrays to expose a pattern on the substrate;
a beam measurer configured to measure beam data of the beam spot arrays;
a calculator configured to calculate a step distance using the measured beam data; and
a controller configured to move at least one of the first and second exposure heads, so as to change a relative separation between the first and second exposure heads, according to the calculated step distance and to perform stitching exposure.

* * * * *